(12) United States Patent
Kim

(10) Patent No.: US 10,446,533 B2
(45) Date of Patent: Oct. 15, 2019

(54) PACKAGE ON PACKAGE WITH INTEGRATED PASSIVE ELECTRONICS METHOD AND APPARATUS

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,057

(22) Filed: Sep. 29, 2017

(65) Prior Publication Data

US 2019/0103388 A1 Apr. 4, 2019

(51) Int. Cl.
| | |
|---|---|
| *H01L 21/00* | (2006.01) |
| *H01L 25/00* | (2006.01) |
| *H01L 23/498* | (2006.01) |
| *H01L 23/538* | (2006.01) |
| *H01L 21/56* | (2006.01) |
| *H01L 21/48* | (2006.01) |
| *H01L 25/18* | (2006.01) |

(52) U.S. Cl.
CPC ............ *H01L 25/50* (2013.01); *H01L 21/486* (2013.01); *H01L 21/56* (2013.01); *H01L 23/49811* (2013.01); *H01L 23/5384* (2013.01); *H01L 25/18* (2013.01); *H01L 2224/16225* (2013.01); *H01L 2224/48091* (2013.01); *H01L 2924/181* (2013.01); *H01L 2924/1815* (2013.01)

(58) Field of Classification Search
CPC . H01L 2224/32225; H01L 2924/15311; H01L 25/0657; H01L 2224/06145; H01L 21/304; H01L 2924/19011; H01L 2225/06558; H01L 23/5222; H01L 25/117
USPC .......................... 438/106, 107, 108, 110, 127
See application file for complete search history.

(56) References Cited

U.S. PATENT DOCUMENTS

| | | | | |
|---|---|---|---|---|
| 2005/0127489 | A1* | 6/2005 | Mallik | H01L 23/04 257/686 |
| 2005/0269681 | A1* | 12/2005 | Asahi | H01L 21/6835 257/686 |
| 2010/0237483 | A1* | 9/2010 | Chi | H01L 21/565 257/686 |
| 2011/0241197 | A1* | 10/2011 | Theuss | B81C 1/00238 257/693 |

(Continued)

*Primary Examiner* — S. V. Clark
(74) *Attorney, Agent, or Firm* — Schwabe, Williamson & Wyatt, P.C.

(57) ABSTRACT

The present application relates to devices and techniques for a package on package multi-package integrated circuit. A component of the integrated circuit maybe located in a void formed in a circuit package of the multi-package integrated circuit. The void may be formed by fabricating a void structure with an internal void corresponding to the component. The void structure may be bonded to a first substrate of a first package in the multi-package integrated circuit. The first substrate and void structure may be encased in a mold compound. A sacrificial layer may be removed, exposing the void in the void structure. The component may be, for example, a through mold via. The first package may be coupled to a second package. Multi-package integrated circuit assemblies fabricated pursuant to the disclosure herein may comprise a higher density of electronic components, including passive electronic components.

9 Claims, 11 Drawing Sheets

(56) References Cited

U.S. PATENT DOCUMENTS

| | | | | |
|---|---|---|---|---|
| 2011/0285005 A1* | 11/2011 | Lin | ................... | H01L 21/4846 257/686 |
| 2013/0095609 A1* | 4/2013 | Theuss | ................ | B81C 1/00238 438/107 |
| 2015/0130041 A1* | 5/2015 | Seo | ................... | H01L 23/3128 257/686 |

* cited by examiner

PACKAGE ON PACKAGE WITH INTEGRATED PASSIVE ELECTRONICS METHOD AND APPARATUS

TECHNICAL FIELD

This document pertains generally, but not by way of limitation, to electronic circuits, such as electronic circuits including multiple electronic packages.

BACKGROUND

Electronic circuits, such as electronic circuits including two or more circuit packages, can be used for logic processing, memory storage, or both. Circuit packages can include one or more chips, such as silicon chips, comprising a plurality of electronic circuits and also referred to as "integrated circuits". For instance, integrated circuits can be used in personal computers, servers, game counsels, internet-of-things devices, and other electronic devices. Datacenter, server, and client device markets seek integrated circuits with higher performance, compact size, and reduced power consumption.

With increasing computing demand, electronic circuits often include multiple chips. For instance, a plurality of chips can be stacked on one another within a circuit package to provide more processing and memory capacity, sometimes referred to as "stacked-die products". However, when combined in this manner, manufacturing flexibility is reduced, because the processor and memory are combined and because it may be difficult to test the memory separately from the processor, which means that testing can only occur after the chips are stacked.

As an alternative to stacked-die products, separate circuit packages can be stacked (e.g., package on package or "PoP") to reduce the amount of board space used to couple the electronic circuit to a printed circuit board (PCB) or substrate of a larger circuit package. However, there is often unused space within stacked circuit packages and additional space must be allowed to create electrical connections between the packages.

Electrical connections (also referred to herein as, "electrical contacts") between stacked circuit packages are often located alongside a chip, for instance, around the perimeter of the chip. The electrical pads of an upper circuit package (also referred to herein as "upper package") and lower circuit package (also referred to herein as "bottom package" or "bottom circuit package") can be specially configured for the stacked arrangement. For instance, the contacts of the upper circuit package may be arranged in an area corresponding to locations around the exterior perimeter of the bottom circuit package. A substrate of the upper or lower circuit package can include dimensions large enough to accommodate the chip foot print and the electrical connections.

Passive electrical components are also commonly included in circuit packages. As used herein, "passive electrical component" refers to, for example, through mold vias (TMVs), resistors, capacitors, magnetic (inductive) devices, transducers, detectors, antennas, and other power delivery, management, or transmission components that are generally incapable of controlling current by means of another electrical signal. Among passive electrical components, legacy TMVs formed, for example, by laser drilling commonly have a cone-shaped cross section when viewed from an elevation perspective.

Electrical connections between two circuit packages and from a circuit package to a PCB or motherboard may be provided by, for example, a ball grid array, a pin grid array, TMVs, and the like.

In some instances, techniques to form voids in a circuit package, such as laser drilling, mechanical drilling, chemical or vapor etching and the like may cause defects and increase fabrication costs.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
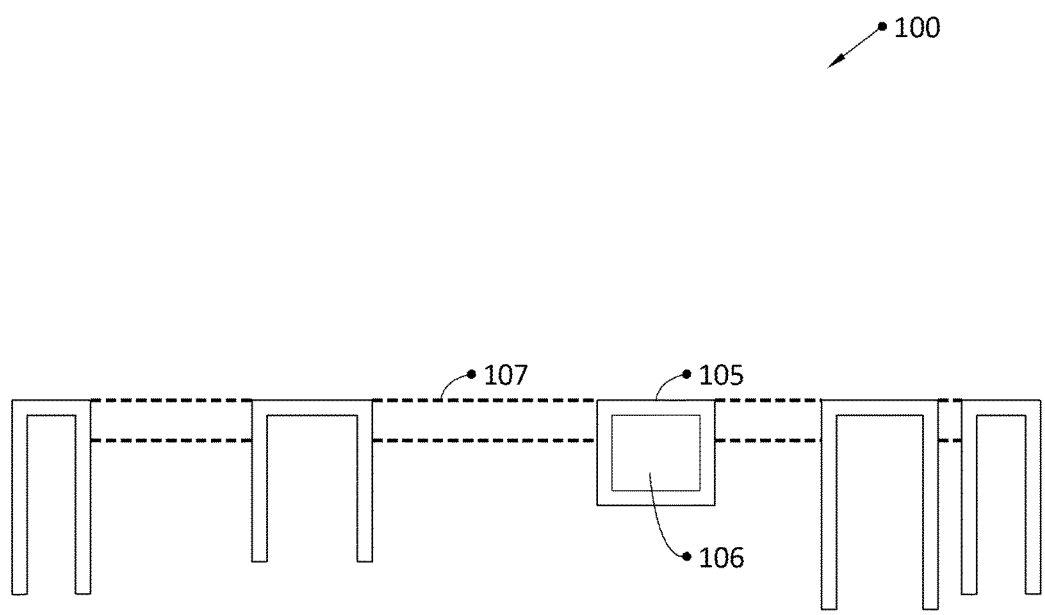
FIG. 1 illustrates an example of void structures, according to an embodiment.

The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass some available equivalents of those claims.

The present application relates to devices and techniques for a multi-package integrated circuit, such as a multi-package integrated circuit assembly including a plurality of circuit packages. A first circuit package may be electrically coupled to a second circuit package, with a passive electronic component located in a void or aperture formed in one of the circuit packages. The void may be formed by fabricating a void structure with an internal void corresponding to the passive electronic component. The void structure may be bonded to a first substrate. The first substrate may comprise a first integrated circuit on a die side of the first substrate. The first substrate, void structure, and first integrated circuit may be encased in a mold compound in a partially formed die side layer of the first circuit package. The void structure may be made from the mold compound.

A sacrificial layer of the partially formed first circuit package may be removed from the die side layer of the first circuit package, exposing the void in the void structure. Additional voids may optionally be formed in the first circuit package, such as through mechanical drilling, laser drilling, chemical etching, or the like. The passive electronic component may be communicatively coupled or bonded (e.g., electrically coupled or physically coupled) to an interface side of a second substrate of the second circuit package; coupling may include one or more of mechanical, electrical, or optical coupling. The passive electronic component, such as a TMV, may be partially formed in the void, after removal of the sacrificial layer. The first circuit package and the second package may be communicatively coupled together, with the passive electronic component in the void.

Multi-package integrated circuit assemblies fabricated pursuant to the disclosure herein may comprise a higher density of electronic components, including passive electronic components, compared to legacy multi-package integrated circuit assemblies. Multi-package integrated circuit assemblies fabricated pursuant to the disclosure herein may be more compact than legacy multi-package integrated circuit assemblies. Multi-package integrated circuit assemblies fabricated pursuant to the disclosure herein may have a more complex structure than legacy multi-package integrated circuit assemblies.

TMVs formed in circuit packages pursuant to the disclosure herein may have side walls that are not conical or not tapered, in contrast to legacy TMVs that have conical or tapered side walls due to, for example, limitations of laser drilling processes. Limitations of laser drilling processes include, for example, diameter and depth aspect ratio minimums. This can create, for example, a minimum width of a TMV given a depth of a mold compound. Other limitations include plasma effect, focal effects, recasting of drilled material, barreling of drilled material, and the like, which produce a laser drilled aperture with a taper. TMVs with conical or tapered side walls occupy more space in a circuit package, in contrast to a TMVs formed pursuant to the disclosure herein, which may have vertical side walls.

The side walls of voids formed according to the disclosure herein may be vertical, curvilinear, may have an inverse taper, or may have a stepped structure.

The headroom or top of a package prepared pursuant to the disclosure herein may be lower than headroom of a package prepared pursuant to legacy techniques. For example, legacy techniques may require that passive electronic components be smaller than mold compound thickness and that they leave a mold cap clearance; 100 μm is an example of a mold cap clearance.

Legacy approaches to PoP assemblies may also place all passives and power components on a substrate, with significant headroom above such components.

In some cases of stacked circuit packages, when one of a plurality of circuit packages in a stack has more input-output (I/O) electrical connections, such circuit package may be placed on the bottom. For example, in a PoP arrangement comprising a logic circuit package and a memory circuit package, the logic circuit package may have more I/O electrical connections (or may have a more complex plurality of electrical connections) than the memory circuit package may have. In this example, the memory circuit package may also provide memory to the logic circuit package, whereas the logic circuit package may provide output to a larger device of which the stacked circuit package is a component. In this example, the logic circuit package may be located on the bottom of the stacked circuit package, with a less dense or less complex ball grid array connection to a top circuit package comprising the memory circuit package. The bottom circuit package may have a denser or more complex ball grid array connection to a motherboard.

To couple an upper package to a lower package, a pinout (e.g., ball grid array) of the upper package can be aligned with TMVs from the bottom package. As previously stated, TMVs are often located around the periphery of the die of the lower package. In other words, the signal contacts of the second package are not located in the center portion of the second package. Accordingly, the size of the bottom package can be increased due to TMV locations around the periphery of the die. Accordingly, the upper or lower packages may be less desirable to sell as independent packages because of a non-standard arrangement of the signal contacts (e.g., being located around the periphery of the die) and larger size. In addition, where package size is limited, the number of die to die interconnections may be reduced because of limited space for TMVs around the periphery of the package.

Packages including stacked silicon dies can have an increased thickness over single die packages. For instance, the package thickness can increase with each additional die. As previously discussed, the TMV can increase in size (e.g., diameter or width) as the length of the TMV increases corresponding to the package thickness due to the TMV taper. Larger TMVs can result in larger dimensions for the electronic package or PoP module as previously discussed. Furthermore, packages with 16 or more dies may include a thickness greater than 1 mm. Forming a TMV through an electronic package with a thickness of 1 mm or greater can be problematic from a manufacturing standpoint.

A problem to be solved by the present disclosure can include packing electronic components, including passive electronic components, more densely in a circuit package, with a more complex design.

The present subject matter can provide a solution to this problem, such as by enabling TMVs with vertical sidewalls and by embedding passive electrical components within a die side layer of one package, such as a bottom package, with the passive electrical components electrically coupled to an interface layer of a second package, such as a top package.

FIGS. 1 through 11 illustrate techniques for fabricating a PoP multi-package integrated circuit according to the disclosure herein.

FIG. 1 illustrates an example of void structures 100 of the present disclosure, according to an embodiment. In FIG. 1, the void structures may be made in various shapes and sizes. For example, void structure 105 is a box, while other of the void structures may be "U" shaped. Other void structures shapes may be fabricated, such as curvilinear structures, tapered structures (including structures with a taper that is inverse of a taper formed in a legacy TMV), and stepped structures. Such void structure shapes may not be possible using legacy processes that involve removal of mold material.

When a void structures encloses an internal space, such as void 106, a gap (not illustrated in void 106) may be left in the void structure to drain or clear an interior of the void structure after or during its fabrication.

Figure 10:
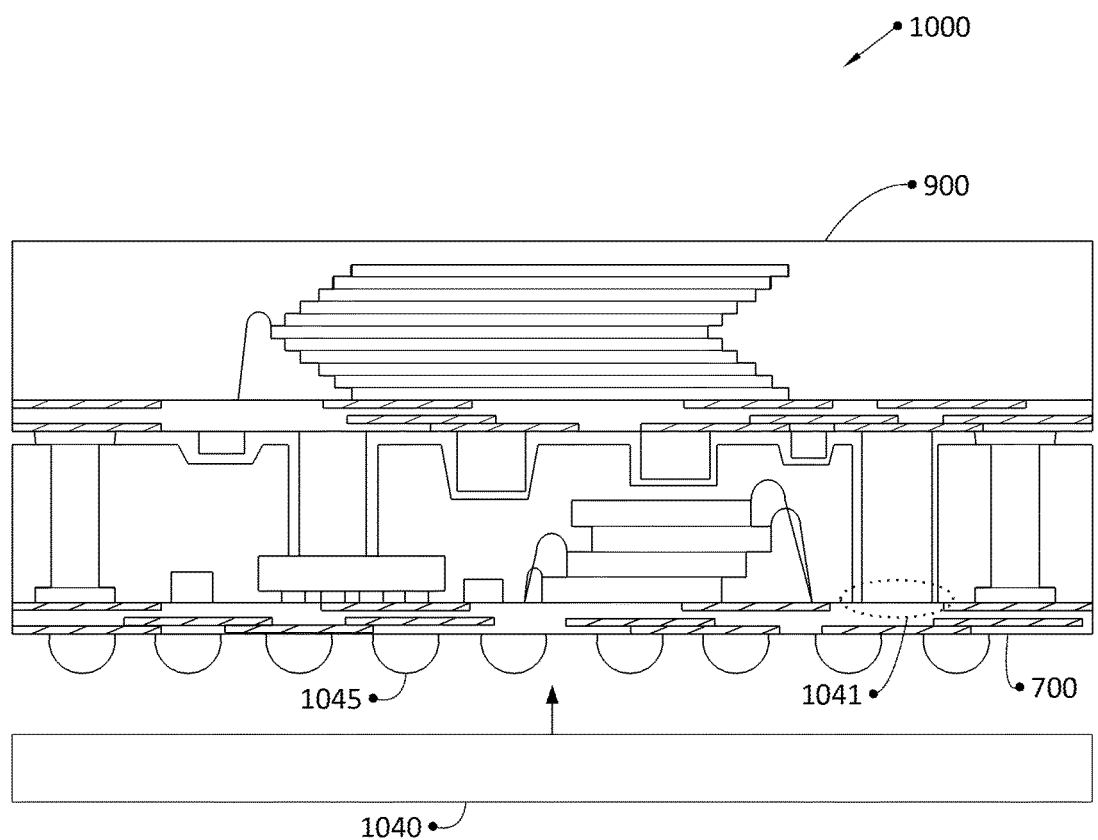
FIG. 10 illustrates the package of FIG. 9 and the package of FIG. 7 assembled into a package on package, according to an embodiment.

Voids in the void structures may be sized to accommodate a component to be inserted into the void. An example of components inserted into the voids of FIG. 1 are illustrated in FIG. 10.

The void structures may be made from, for example, a substance such as a mold compound. The mold compound may be, for example, an epoxy, a polymer, a plastic, liquid crystal polymer, nylon, epoxy, silica or the like. The void structure substance may be selected to withstand heat, as may occur during a reflow process. An external surface of the void structure may be textured and/or chemically treated to facilitate bonding with a mold compound, a substrate, a die, or the like. The void structure substance may be selected to bond with a mold compound or another component. The void structure substance or mold compound may be an insulative covering. The insulative covering may electrically or physically isolate a component.

The void structures illustrated in FIG. 1 are illustrated with a physical arrangement to accommodate components to be inserted into the void structures. A brace between the void structures to facilitate maintenance of such a physical arrangement during manufacture may be fabricated. Such a brace may be fabricated separately from or in conjunction with fabrication of the void structures. For example optional brace 107 is illustrated in FIG. 1 with dotted lines.

Figure 2:
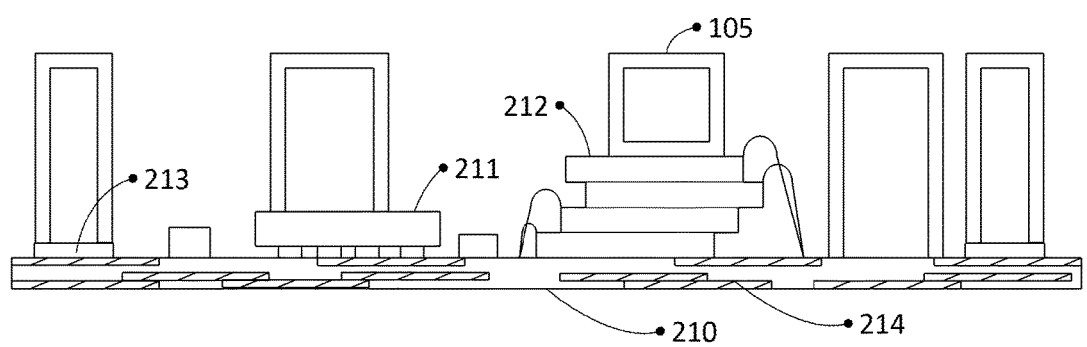
FIG. 2 illustrates an example of the void structures of FIG. 1, mounted to a substrate, according to an embodiment.

FIG. 2 illustrates an example of the void structures of FIG. 1, mounted to substrate 210 and to other components, such as die 211, stacked-die 212, and to electrical contact 213, according to an embodiment. Mounting of the void structures to the substrate may be through, for example, chemical bonding, physical attachment, or the like. Substrate 210 is illustrated as comprising electrical routing layers for electrical communication, such as electrical interconnects 214. The location of electrical interconnects 214 in FIG. 2 (and of other electrical interconnects in other of the Figures) is by way of example, only.

Die 211 or stacked-die 212 may include a semiconductive material, such as monocrystalline silicon, gallium arsenide, or the like. In various examples, a die can be configured as a processor (e.g., graphics processing unit (GPU) or central processing unit (CPU)), memory package (e.g., random access memory (RAM), flash memory, read only memory (ROM)), or other logic or memory package. The die can include at least one electrical contact (die interconnect). For instance, the die interconnect can include, but is not limited to a solder pad, ball grid array (BGA), land grid array (LGA), wire-bond pad, chip carrier contact, or other electrical contact for electrically coupling the die to the substrate, such as substrate 210.

Substrate 210 can provide mechanical support to a die and can provide one or more electrical routing layers for electrical communication between the die and the electronic device. Substrates can include a die side and an interface side. Substrates discussed herein may include insulating dielectric materials and conductive materials (e.g. electrical routing layers, metallic foil, copper clad laminate, and the like). The dielectric material can include at least one dielectric layer fabricated from materials including, but not limited to, FR-4, prepreg, ceramic, epoxy, other glass or fiber filled resin, polyimide, polyester, polyether ether ketone (PEEK), or the like. Conductive and dielectric materials may be printed, for example, with an inkjet printer or the like and may be etched. Conductive materials may be electrodeposited (electroplated), may be formed into one or more electronic circuits. Conductive material of a substrate may provide circuit routing, grounding, thermal energy distribution, electromagnetic shielding, or the like.

Substrates may include multiple layers. Substrates may include contacts on either or both an interface side and a die side. Contacts may be exposed to be coupled to another contact or an electronic or other component. Contacts may be arranged to be interchangeable with dies, electronic packages, or electronic devices, including according to industry standard formats.

Figure 3:
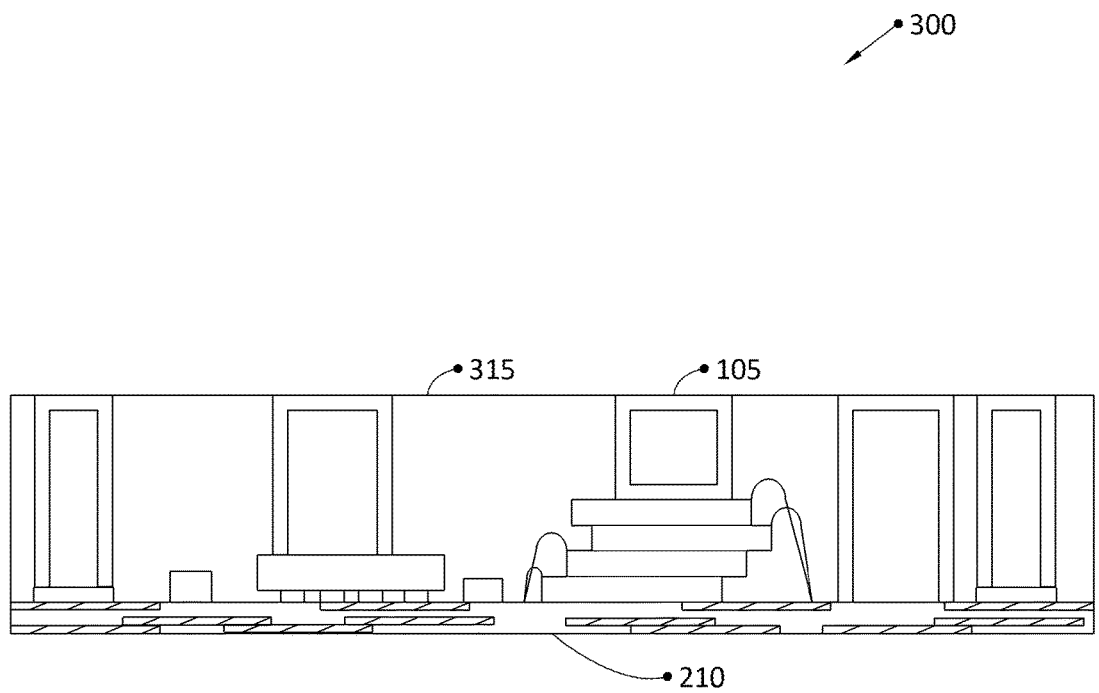
FIG. 3 illustrates the void structures, substrate, and other components of FIG. 2, encased in mold compound in a partially formed package, according to an embodiment.

FIG. 3 illustrates the void structures, substrate, and other components of FIG. 2, encased in mold compound 315 in a partially formed package 300, according to an embodiment. Encasement of such components may be via injection molding, deposition, 3D printing, by bonding of a form around the components of FIG. 2, and the like. The exterior perimeters of the void structures, such as of void structure 105, are illustrated in FIG. 3 for the sake of understanding encasement of such structures in the mold compound. However, in an embodiment, such exterior perimeters may be difficult to distinguish from and/or may merge with mold compound 315, such as when the void structures are made of a same material as mold compound 315. For example, in subsequent figures, the exterior perimeters of the void structures are not illustrated. Package 300 may be a bottom package.

Figure 4:
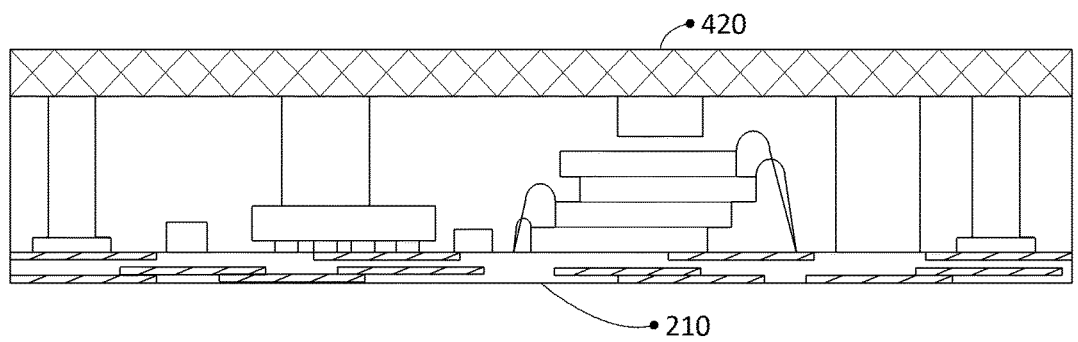
FIG. 4 illustrates the partially formed package of FIG. 3, and a sacrificial layer, according to an embodiment.

FIG. 4 illustrates partially formed package 300 of FIG. 3, and sacrificial layer 420, according to an embodiment. Sacrificial layer 420 may be removed, such as through mechanical grinding, laser etching, liquid or vapor chemical etching, and the like. Sacrificial layer 420 has not been removed in FIG. 4, but is indicated to show where sacrificial layer 420 is to be removed.

Figure 5:
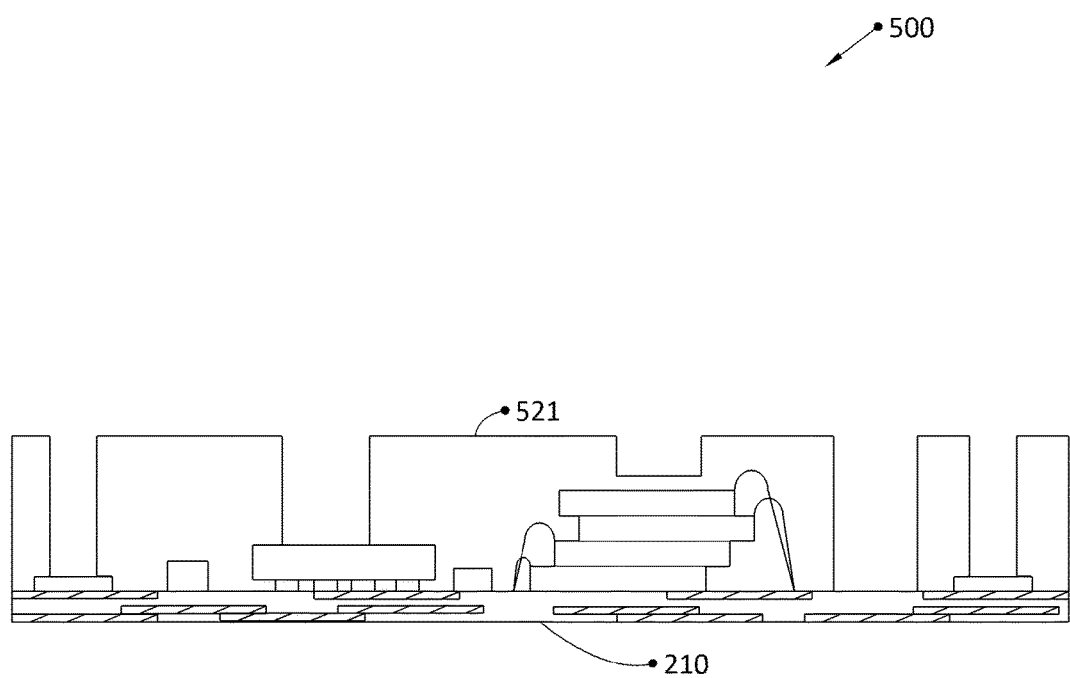
FIG. 5 illustrates the partially formed package of FIG. 3, with the sacrificial layer of FIG. 4 removed, exposing voids and creating a further partially formed package, according to an embodiment.

FIG. 5 illustrates further partially formed package of FIG. 3, with sacrificial layer 420 of FIG. 4 removed, exposing voids and creating a further partially formed package 500, according to an embodiment. A top die side layer 521 of further partially formed package 500 is labeled. As noted, partially formed package 500 may be a bottom package.

Figure 6:
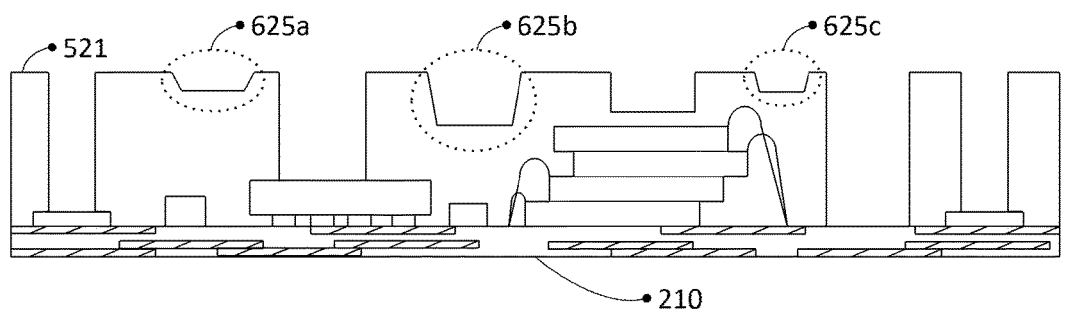
FIG. 6 illustrates the formation of additional voids in the further partially formed package, according to an embodiment.

FIG. 6 illustrates the formation of optional additional voids 625a-625c in the top die side layer 521 of further partially formed package 500, according to an embodiment. Additional voids 625a-625c may be formed by a legacy void forming process, such as mechanical drilling, laser drilling, chemical etching, and the like. It may be possible to form additional voids 625a-625c through the use of void structures, illustrated above. Formation of additional voids 625a-625c through legacy void forming processes is discussed to demonstrate that use of void structures, as described herein, and legacy void forming processes may co-exist. Additional voids 625a-625c may have been formed through legacy void forming processes before removal of sacrificial layer 420. As illustrated, additional voids 625a-625c may have a non-vertical cross-section, such as due to limitations of legacy void forming processes.

Figure 7:
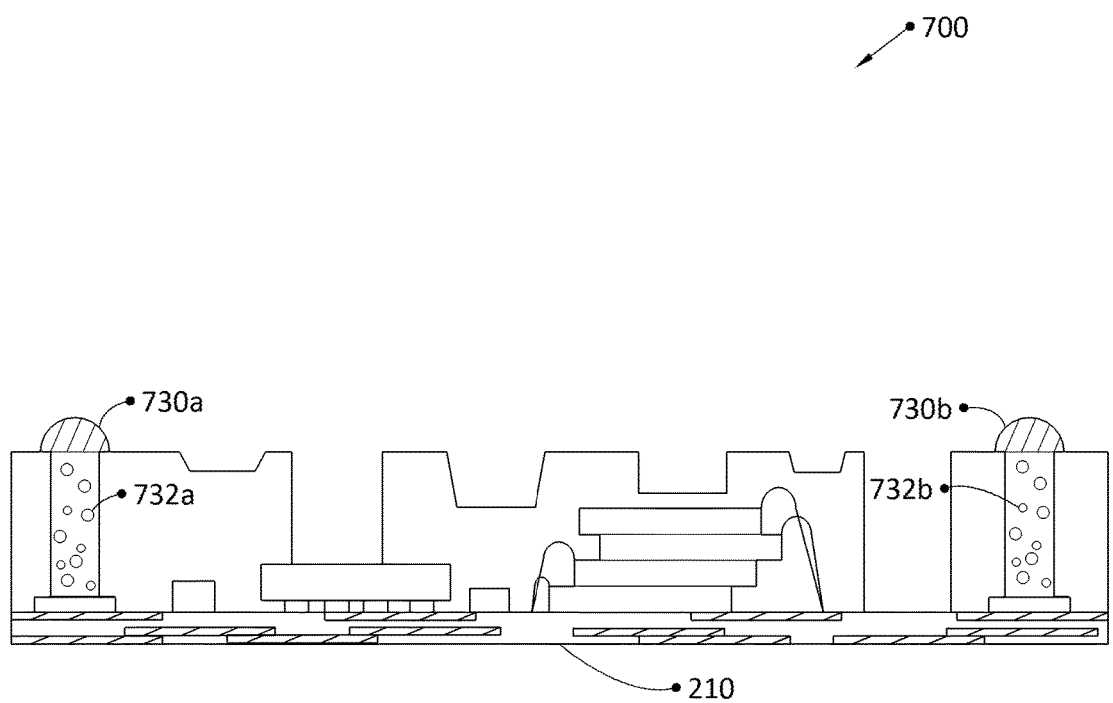
FIG. 7 illustrates assembly of through mold vias in the partially formed package, according to an embodiment.

FIG. 7 illustrates assembly of TMVs in the partially formed package, according to an embodiment. TMVs may be formed by filling voids with conductor 732a and 732b and capping such conductors with, for example, solder paste 730a and 730b. Filling voids with conductor 732a and 732b may be through electroless (electroplating) Cu plating, solder paste plating, or the like. The result may be package 700, prepared for assembly with another package. As noted, package 700 may be a bottom package.

Figure 8:
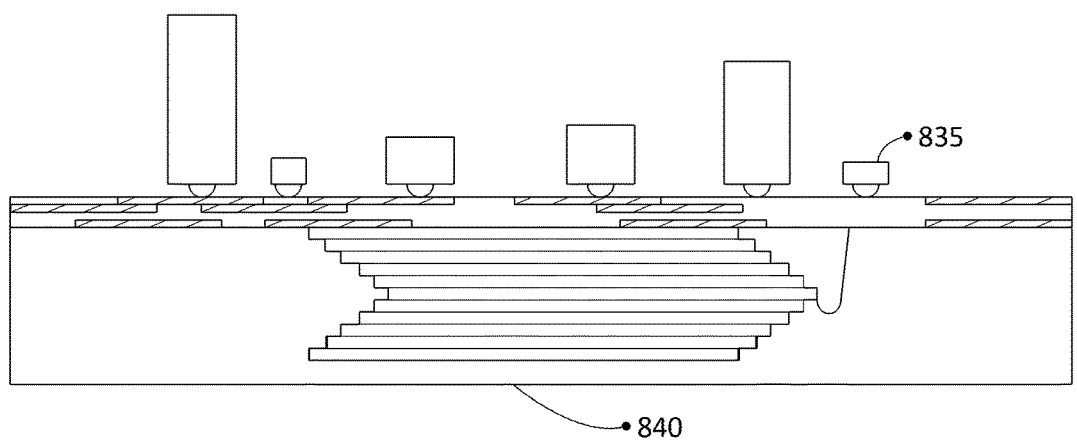
FIG. 8 illustrates assembly of passive electrical components on a package in an inverted position, according to an embodiment.

FIG. 8 illustrates assembly of passive electrical components, such as passive electrical component 835, on package 840, according to an embodiment. Assembly of passive electrical components on package 840 may be through reflow soldering, chemical bonding, and other techniques that may electrically and/or physically bond or couple such passive electrical components to an interface side of package 840 and to electrical interconnect(s) within a substrate of package 840 (as noted above, the location of electrical interconnects within a substrate are by way of example). Package 840 may be in an inverted position to facilitate assembly. Package 840 may be a top package. As illustrated, package 840 may contain a die, such as a memory die, a stacked memory die. Package 840 may contain a die such as a processor or another circuit or integrated circuit.

Figure 9:
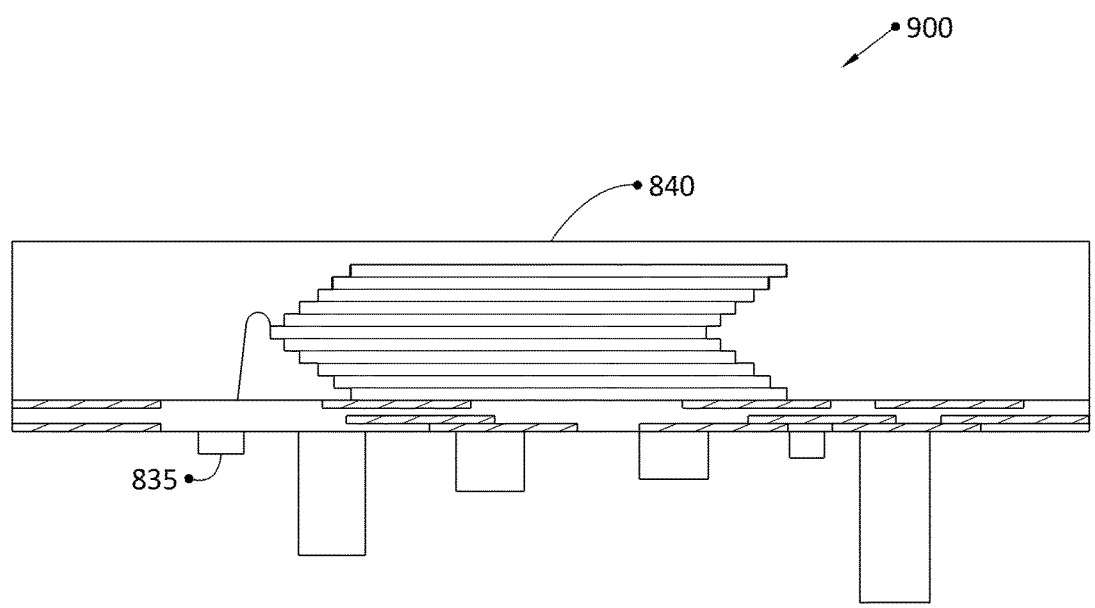
FIG. 9 illustrates a package to be assembled with the package of FIG. 7, according to an embodiment.

FIG. 9 illustrates package 900, to be assembled with package 700 of FIG. 7, according to an embodiment. Package 900 comprises package 840 coupled to passive electrical components of FIG. 8. Package 900 may be a top package. As illustrated, package 900 may be in an orientation for insertion into voids of package 700.

FIG. 10 illustrates package 900 of FIG. 9 and package 700 of FIG. 7 assembled into PoP 1000, in an embodiment, for example, such as after package 900 and package 700 are electrically or physically coupled. Electrical or physical coupling may be through reflow soldering of solder balls 730a and 730b to electrical contacts on an interface side of a substrate of package 900, thereby completing TMV connections between the packages. Other techniques may be used to electrically or physically couple package 900 and package 700, such as with adhesive (e.g., epoxy), die attach film, thermal bonding, ultra-sonic welding, or the like.

Clearance between the packages of PoP 1000 may be reduced, relative to legacy multi-package integrated circuit. PoP 1000 may comprise, for example, TMVs with vertical side walls. As discussed herein, TMVs with vertical side walls may allow the packages of PoP 1000 to be smaller in one or more axis (in an x, y, and z axis coordinate system). In addition, PoP 1000 may include passives or other components placed in headroom above other passives (or other components) on a package, such as on a bottom package.

Electrical or physical coupling of package 900 and package 700 may also include electrical or physical coupling of a component of package 900 with a component or surface of package 700. For example, dotted circle 1041 in FIG. 10 illustrates where a component of package 900 may be electrically or physically coupled to a surface of package 700 within a void formed in package 700, as discussed above.

PoP 1000 may be prepared for assembly with another component, such as motherboard 1040. For example, as illustrated in FIG. 10, PoP 1000 may comprise solder balls 1045, to be reflow soldered to motherboard 1040.

Figure 11:
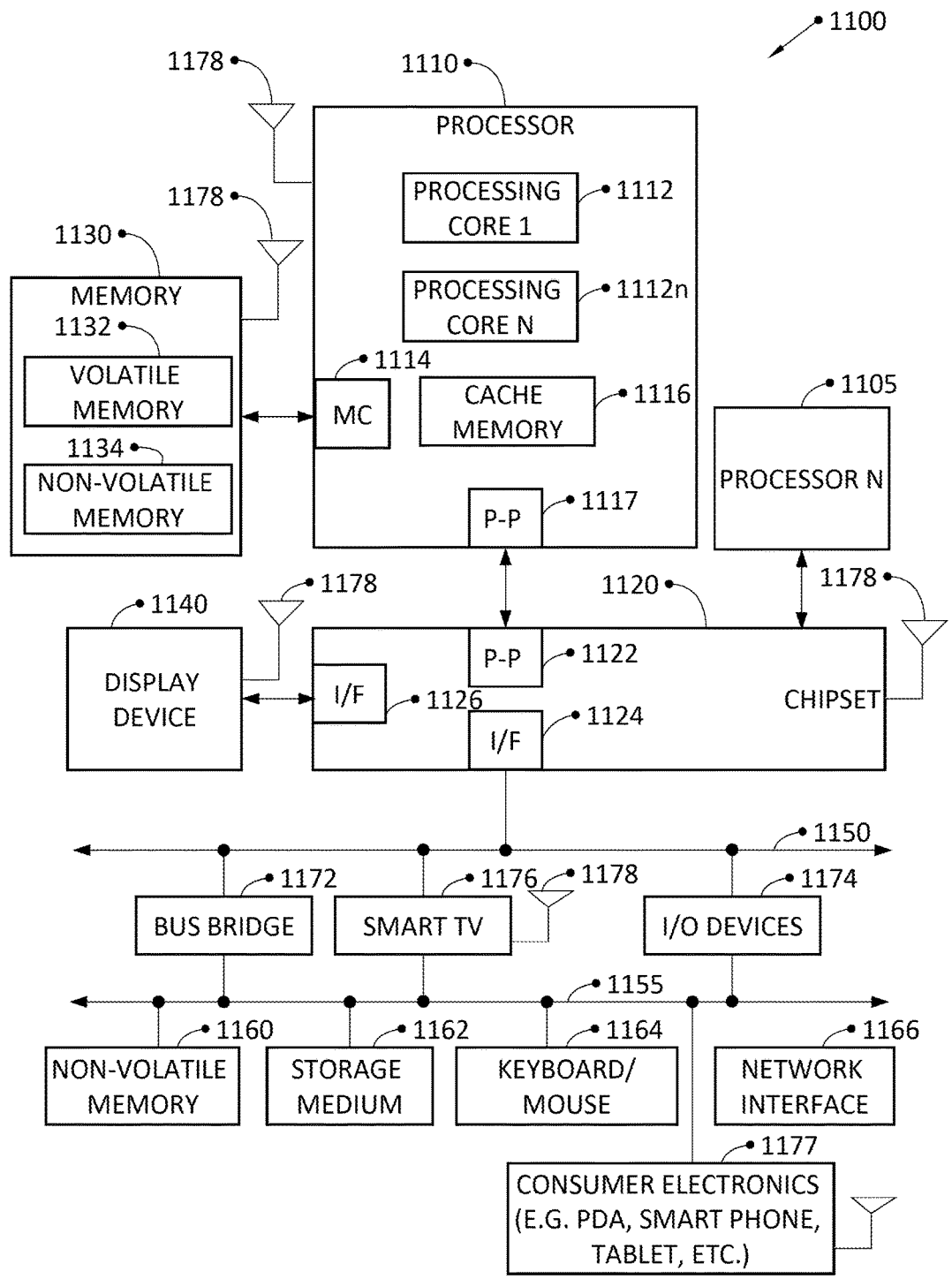
FIG. 11 illustrates a system level diagram, according to an embodiment.

FIG. 11 illustrates a system level diagram, according to an embodiment. For instance, FIG. 11 depicts an example of an electronic device (e.g., system) including a multi-package integrated circuit, such as a multi-package integrated circuit including PoP prepared as described in the present disclosure. FIG. 11 is included to show an example of a higher level device application for the PoP. In one embodiment, system 1100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1100 is a system on a chip (SOC) system.

In one embodiment, processor 1110 has one or more processing cores 1112 and 1112n, where 1112n represents the Nth processor core inside processor 1110 where N is a positive integer. For instance, processing core 1112 or processing core 1112n can include dies, as described herein. In one embodiment, system 1100 includes multiple processors including 1110 and 1105, where processor 1105 has logic similar or identical to the logic of processor 1110. In an example, the processor 1110 can include the die 211 or stacked-die 212. In some embodiments, processing core 1112 includes, but is not limited to, pre-fetch logic to fetch instructions, decode logic to decode the instructions, execution logic to execute instructions and the like. In some embodiments, processor 1110 has a cache memory 1116 to cache instructions and/or data for system 1100. Cache memory 1116 may be organized into a hierarchal structure including one or more levels of cache memory.

In some embodiments, processor 1110 includes a memory controller 1114, which is operable to perform functions that enable the processor 1110 to access and communicate with memory 1130 that includes a volatile memory 1132 and/or a non-volatile memory 1134. In some embodiments, processor 1110 is coupled with memory 1130 and chipset 1120. In an example, the memory 1130 can include or be part of package 900 or package 700. Processor 1110 may also be coupled to a wireless antenna 1178 to communicate with any device configured to transmit and/or receive wireless signals. In one embodiment, wireless antenna 1178 may comprise an interface to operate in accordance with, but is not limited to, the IEEE 802.11 standard and its related family, Home Plug AV (HPAV), Ultra Wide Band (UWB), Bluetooth, WiMax, Long Term Evolution, or any form of wireless communication protocol.

In some embodiments, volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1134 includes, but is not limited to, flash memory, phase change memory (PCM), read-only memory (ROM), electrically erasable programmable read-only memory (EEPROM), or any other type of non-volatile memory device.

Memory 1130 stores information and instructions to be executed by processor 1110. In one embodiment memory 1130 may also store temporary variables or other intermediate information while processor 1110 is executing instructions. In the illustrated embodiment, chipset 1120 connects with processor 1110 via Point-to-Point (PtP or P-P) interfaces 1117 and 1122. Chipset 1120 enables processor 1110 to connect to other elements in system 1100. In some embodiments, interfaces 1117 and 1122 operate in accordance with a PtP communication protocol such as the Intel® QuickPath Interconnect (QPI) or the like. In other embodiments, a different interconnect may be used.

In some embodiments, chipset 1120 is operable to communicate with processor 1110, 1105, display device 1140, and other devices 1172, 1176, 1174, 1160, 1162, 1164, 1166, 1177, etc. In an example, the chipset 1120 can include die 211 or stacked-die 212. Chipset 1120 may also be coupled to a wireless antenna 1178 to communicate with any device configured to transmit and/or receive wireless signals.

Chipset 1120 connects to display device 1140 via interface 1126. Display 1140 may be, for example, a liquid crystal display (LCD), a plasma display, cathode ray tube (CRT) display, or any other form of visual display device. In some embodiments, processor 1110 and chipset 1120 are merged into a single SOC. In addition, chipset 1120 connects to one or more buses 1150 and 1155 that interconnect various elements 1174, 1160, 1162, 1164, and 1166. Buses 1150 and 1155 may be interconnected together via a bus bridge 1172. In one embodiment, chipset 1120, via interface 1124, couples with a non-volatile memory 1160, a mass storage device(s) 1162, a keyboard/mouse 1164, a network interface 1166, smart TV 1176, consumer electronics 1177, etc. In various examples, an integrated circuit can be included in at least one or more of the display 1140, smart TV 1176, I/O devices 1174, non-volatile memory 1160, storage medium 1162, network interface 1166, processor 1105, or consumer electronics device 1177.

In one embodiment, mass storage device 1162 includes, but is not limited to, a solid state drive, a hard disk drive, a universal serial bus flash memory drive, or any other form of computer data storage medium. In one embodiment, network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, Long Term Evolution (LTE) or any form of wireless communication protocol.

While the modules shown in FIG. 11 are depicted as separate blocks within system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into processor core 1112.

VARIOUS NOTES & EXAMPLES

Each of these non-limiting examples may stand on its own, or may be combined in various permutations or combinations with one or more of the other examples. To better illustrate the method and apparatuses disclosed herein, a non-limiting list of embodiments is provided here:

Example 1

A method of fabricating a multi-package integrated circuit comprising: preparing a void structure comprising a void, wherein the void is sized to accommodate a passive electrical component; preparing a bottom circuit package comprising a bottom circuit package substrate and comprising a first integrated circuit and the void structure in a die side layer of the bottom circuit package; removing a sacrificial layer from the die side layer of the bottom circuit package to expose the void in the void structure; preparing a top circuit package comprising a top circuit package substrate, a second integrated circuit in a die side layer of the top circuit package substrate; positioning or forming the passive electrical component in the void; electrically coupling the passive electrical component to an interface side of the top circuit package substrate; and mounting the top circuit package substrate to the bottom circuit package substrate with the passive electrical component in the void.

Example 2

The method according to Example 1, further comprising electrically coupling the passive electrical component to the interface side of the top circuit package substrate before mounting the top circuit package substrate to the bottom circuit package with the passive electrical component in the void.

Example 3

The method according to Example 2, wherein the passive electrical component is taller than a height of the bottom circuit package.

Example 4

The method according to Example 1, wherein the passive electrical component comprises at least one of a resistor, capacitor, power component, or through mold via (TMV).

Example 5

The method according to Example 4, further comprising forming the TMV in the void and wherein at least one of electrically coupling the TMV to the interface side of the top circuit package substrate or mounting the top circuit package substrate to the bottom circuit package with the passive electrical component in the void is performed by reflow soldering.

Example 6

The method according to Example 4, further comprising preparing the void structure with a vertical wall of the void in the void structure perpendicular to a horizontal floor of the void in the void structure.

Example 7

The method according to Example 4, further comprising preparing the void structure with a stepped wall of the void in the void structure.

Example 8

The method according to Example 4, wherein forming the TMV in the void comprises filling the void with a conductor, capping the conductor with a solder paste, and wherein reflow soldering melts the solder paste.

Example 9

The method according to Example 1, wherein preparing the void structure comprises preparing the void structure from a material of the bottom circuit package.

Example 10

The method according to Example 8, wherein the material of the bottom circuit package is a polymer based mold compound.

Example 11

The method according to Example 1, wherein removing a sacrificial layer from the die side layer of the bottom circuit package to expose the void in the void structure comprises removing the sacrificial layer by grinding.

Example 12

The method according to Example 1, wherein the void is a first void, the passive electrical component is a first passive electrical component and further comprising forming a second void in the bottom circuit package by a void forming process and inserting or forming a second passive electrical component in the second void.

Example 13

The method according to Example 11, wherein the void forming process comprises at least one of mechanical drilling, laser drilling, or chemical etching.

Example 14

The method according to Example 1, wherein the mounting the top circuit package substrate to the bottom circuit package substrate is with a first ball grid array and wherein mounting the top circuit package substrate to the bottom circuit package with the passive electrical component in the void with the first ball grid array comprises electrically coupling the top circuit package and the bottom circuit package with the first ball grid array, wherein the bottom circuit package comprises an interface side of a bottom circuit package substrate, and electrically coupling the interface side of the bottom circuit package substrate to a motherboard with a second ball grid array.

Example 15

The method according to Example 13, wherein the second ball grid array forms more electrical contacts between the interface side of the bottom circuit package substrate and the motherboard than the first ball grid array forms between the interface side of the top circuit package substrate and the bottom circuit package.

Example 16

The method according to Example 1, wherein the second integrated circuit comprises a stacked memory die and wherein the first integrated circuit comprises a computer processor.

Example 17

A multi-package integrated circuit comprising a top circuit package and a bottom circuit package, wherein the top circuit package comprises a first integrated circuit, a top circuit package substrate, and a passive electrical component electrically coupled to an interface side of the top circuit package substrate, wherein the bottom circuit package comprises a second integrated circuit and a void, and wherein the top circuit package and the bottom circuit package are electrically coupled and wherein the passive electrical component is positioned in or formed in the void.

Example 18

The multi-package integrated circuit of Example 16, wherein the void is a hollow nucleus of a void structure molded into the bottom circuit package.

Example 19

The multi-package integrated circuit of Example 17, wherein the void structure is made from a material of the bottom circuit package.

Example 20

The multi-package integrated circuit of Example 18, wherein the material of the bottom circuit package is a polymer based mold compound.

Example 21

The multi-package integrated circuit of Example 16, wherein the void is a first void, the passive electrical component is a first passive electrical component and further comprising a second void in the bottom circuit package and a second passive electrical component in the second void.

Example 22

The multi-package integrated circuit of Example 16, wherein the passive electrical component is taller than a height of the bottom circuit package.

Example 23

The multi-package integrated circuit of Example 16, wherein the passive electrical component comprises at least one of a resistor, capacitor, power component, or through mold via (TMV).

Example 24

The multi-package integrated circuit of Example 22, wherein the passive electrical component is electrically coupled to the bottom circuit package.

Example 25

The multi-package integrated circuit of Example 22, wherein the bottom circuit package comprises a bottom circuit package substrate and wherein the TMV comprises vertical walls perpendicular to the top circuit package substrate and the bottom circuit package substrate.

Example 26

The multi-package integrated circuit of Example 16, wherein the top circuit package and the bottom circuit package are electrically coupled by a first ball grid array and wherein an interface side of a bottom circuit package substrate of the bottom circuit package is mounted to a motherboard by a second ball grid array.

Example 27

The multi-package integrated circuit of Example 25, wherein the second ball grid array forms more electrical contacts between the interface side of the bottom circuit package substrate and the motherboard than the first ball grid array forms between the interface side of the top circuit package substrate and the bottom circuit package.

Example 28

The multi-package integrated circuit of Example 16, wherein the first integrated circuit comprises a stacked memory die and the second integrated circuit comprises a computer processor.

Example 29

A computer device comprising: a top circuit package, a bottom circuit package, and a motherboard, wherein the top circuit package comprises a first integrated circuit, a top circuit package substrate, and a passive electrical component electrically coupled to an interface side of the top circuit package substrate, wherein the bottom circuit package comprises a second integrated circuit and a void, wherein the top circuit package and the bottom circuit package are electrically coupled by a first ball grid array, wherein the passive electrical component is positioned in or formed in the void, and wherein an interface side of a bottom circuit package substrate of the bottom circuit package is mounted to the motherboard by a second ball grid array.

Example 30

The computer device of Example 28, wherein the void is a hollow nucleus of a void structure molded into the bottom circuit package.

Example 31

The computer device of Example 29, wherein the void structure is made from a material of the bottom circuit package.

Example 32

The computer device of Example 30, wherein the material of the bottom circuit package is a polymer based mold compound.

Example 33

The computer device of Example 28, wherein the void is a first void, the passive electrical component is a first passive electrical component and further comprising a second void in the bottom circuit package and a second passive electrical component in the second void.

Example 34

The computer device of Example 28, wherein the passive electrical component is taller than a height of the bottom circuit package.

Example 35

The computer device of Example 28, wherein the passive electrical component comprises at least one of a resistor, capacitor, power component, or through mold via (TMV).

Example 36

The computer device of Example 34, wherein the passive electrical component is electrically coupled to the bottom circuit package.

Example 37

The computer device of Example 34, wherein the bottom circuit package comprises a bottom circuit package substrate and wherein the TMV comprises vertical walls perpendicular to the top circuit package substrate and the bottom circuit package substrate.

Example 38

The computer device of Example 28, wherein the ball grid array is a first ball grid array and wherein an interface side of a bottom circuit package substrate of the bottom circuit package is mounted to a motherboard by a second ball grid array.

Example 39

The computer device of Example 37, wherein the second ball grid array forms more electrical contacts between the interface side of the bottom circuit package substrate and the motherboard than the first ball grid array forms between the interface side of the top circuit package substrate and the bottom circuit package.

Example 40

The computer device of Example 28, wherein the first integrated circuit comprises a stacked memory die and the second integrated circuit comprises a computer processor.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosure herein should be determined with reference to the appended claims, along with the full scope of equivalents to which such claims are entitled.

What is claimed is:

1. A method of fabricating a multi-package integrated circuit comprising:
    forming a bottom circuit package, including providing a bottom circuit package substrate, placing a first integrated circuit on the substrate; disposing a mold compound layer on the substrate to encapsulate the first integrated circuit; and disposing first and second void structures in the mold compound layer, wherein the first and second void structures have first and second heights, wherein the first height is greater than the second height, wherein forming the bottom circuit package further includes disposing a conductor via through the mold compound layer, including forming the conductor via with vertical sidewalls in the mold compound, and filling the conductor via with a conductive material;
    forming a top circuit package, including providing a top circuit package substrate; disposing a second integrated circuit in a die side layer of the top circuit package substrate; and disposing first and second passive electrical components on an interface side of the top package substrate to match the disposition of the first and second void structures of the bottom package substrate, wherein the first and second passive electrical components have first and second component heights that respectively match the first and second heights of the first and second void structures, wherein the first component height is greater than the second component height; and
    mounting the top circuit package to the bottom circuit package, including inserting the first and second passive electrical components in the first and second void structures respectively; and electrically coupling the bottom circuit package to the interface side of the top circuit package substrate, wherein the conductor via with vertical sidewalls provides at least a part of the electrical coupling between the top and bottom circuit packages.

2. The method according to claim 1, further comprising electrically coupling the first and second passive electrical components to the interface side of the top circuit package substrate before mounting the top circuit package substrate to the bottom circuit package.

3. The method according to claim 1, wherein the first and second passive electrical components comprise at least one of a resistor, capacitor, power component, or through mold via (TMV).

4. The method according to claim 3, wherein mounting the top circuit package substrate to the bottom circuit package is performed by reflow soldering.

5. The method according to claim 1, further comprising forming a vertical wall of the first and second void structures to be disposed perpendicular to a horizontal floor of the first and second void structures.

6. The method according to claim 1, further comprising removing a sacrificial layer from the bottom circuit package to expose the first and second void structures.

7. The method according to claim 1, wherein disposing the first and second void structures includes at least one of mechanical drilling, laser drilling, or chemical etching of the mold compound layer.

8. The method according to claim 1, wherein mounting the top circuit package to the bottom circuit package includes electrically coupling the top circuit package and the bottom circuit package with a first ball grid array, wherein the bottom circuit package comprises an interface side of a bottom circuit package substrate, and electrically coupling the interface side of the bottom circuit package substrate to a motherboard with a second ball grid array.

9. The method according to claim 8, wherein the second ball grid array forms more electrical contacts between the interface side of the bottom circuit package substrate and the motherboard than the first ball grid array forms electrical contacts between the interface side of the top circuit package substrate and the bottom circuit package.

* * * * *